United States Patent
Okeshi et al.

[11] Patent Number: 5,859,488
[45] Date of Patent: Jan. 12, 1999

[54] PIEZOELECTRIC ELEMENT AND METHOD OF PRODUCING SAME

[75] Inventors: Motoyuki Okeshi, Shiga-ken; Yasuo Otowaki, Kyoto; Koichi Nitta, Oumihachiman; Satoru Hachinohe, Yokaichi; Takashi Hashimoto; Makoto Irie, both of Toyama, all of Japan

[73] Assignee: Murata Manufacturing Co., Ltd., Kyoto-fu, Japan

[21] Appl. No.: 923,196

[22] Filed: Sep. 4, 1997

[30] Foreign Application Priority Data

Jan. 14, 1997 [JP] Japan .................................. 9-017564

[51] Int. Cl.$^6$ ........................................... H01L 41/08
[52] U.S. Cl. ........................ 310/368; 310/348; 310/366
[58] Field of Search .................................. 310/344, 348, 310/354, 355, 365–368

[56] References Cited

U.S. PATENT DOCUMENTS

| | | | |
|---|---|---|---|
| 4,431,938 | 2/1984 | Inoue | 310/348 |
| 4,455,502 | 6/1984 | Nakatani | 310/368 |
| 4,455,503 | 6/1984 | Nakatani | 310/368 |
| 4,503,352 | 3/1985 | Inoue | 310/366 X |

Primary Examiner—Mark O. Budd
Attorney, Agent, or Firm—Graham & James LLP

[57] ABSTRACT

A piezoelectric element prevents the development of a short circuit between separate electrodes and provides a high level of connection reliability. The piezoelectric element utilizing a longitudinal oscillation mode includes a piezoelectric substrate which has on one main surface thereof a first electrode and a second electrode separated by longitudinally extending linear grooves and, on the other main surface, a third electrode. Conductive support members are secured to node sections of the first and second electrodes so as to be spaced apart from each other with respect to the longitudinal dimension of the piezoelectric substrate.

8 Claims, 6 Drawing Sheets

PIEZOELECTRIC ELEMENT AND METHOD OF PRODUCING SAME

BACKGROUND OF THE INVENTION

1. Field of the Invention

The present invention relates to a piezoelectric element utilizing a longitudinal oscillation mode for use in an AM filter or other electronic components.

2. Description of the Related Art

In a known conventional piezoelectric element utilizing a longitudinal oscillation mode, a first main surface of a piezoelectric substrate is provided with input and output electrodes that are formed by dividing electrode material via a longitudinally extending linear groove, and a second main surface of the piezoelectric substrate is provided with a common electrode, wherein a part of each of the input and output electrodes is provided with a separate, independent support section which is formed of an isotropic elastic conductive material and which constitutes an electrical contact section for achieving electrical contact with an external conductor as described in Japanese Patent Unexamined Publication No. 2-224515. The above-mentioned support sections are arranged on either side of the groove and at a common position with respect to the longitudinal dimension of the input and output electrodes.

In the above-described piezoelectric element, the distance between the support members, which are spaced apart from each other, is small. Thus, when the piezoelectric element as described above is connected to external conductors, such as terminals of a case for an electronic component, with the input and output electrodes facing downwards, it is necessary for the external conductors to be located in close proximity to each other. Thus, if there is a small positional deviation of the piezoelectric element, a short circuit may be developed between the input and output electrodes.

In the above-described piezoelectric element, the elastic support sections thereof are connected to terminals of a case by bringing them into elastically biased contact with the terminals. In effecting this connection, the support sections may be connected and fixed to pattern electrodes of a mounting substrate or the like by using a conductive adhesive or the like. In this case, due to the small distance between the support sections of the input and output electrodes, a short circuit may be developed between the input and output electrodes if the conductive adhesive is spread to only a small amount, resulting in a deterioration in reliability of the electrical connection.

SUMMARY OF THE INVENTION

To overcome the problems discussed above, the preferred embodiments of the present invention provide a piezoelectric element which prevents a short circuit from being developed between the separate electrodes of the piezoelectric element, thereby achieving an improvement in terms of reliability of electrical connection.

In accordance with one preferred embodiment of the present invention, there is provided a piezoelectric element utilizing a longitudinal oscillation mode and including a piezoelectric substrate, wherein a first main surface of the piezoelectric substrate is provided with first and second electrodes separated from each other by a longitudinally extending linear groove, and wherein a third electrode is provided on a second main surface of the piezoelectric substrate, conductive support members being fixed to node portions of the first and second electrodes so as to be spaced apart from each other with respect to the longitudinal dimension of the piezoelectric substrate.

When the first and second electrodes of the piezoelectric element are connected to external conductors, it is possible for the external conductors to be longitudinally spaced apart from each other because the support members fixed to the electrodes are provided so as to be spaced apart from each other with respect to the longitudinal dimension of the piezoelectric substrate. Thus, there is almost no chance that a short circuit will be developed between the first and second electrodes even when the piezoelectric element undergoes a positional deviation.

The support members are preferably provided at the node portion of the piezoelectric element, that is, substantially in the middle portion with respect to the longitudinal dimension thereof. In the preferred embodiments of the present invention, the node portion includes not only a completely non-oscillating portion of the piezoelectric element but also a range which will not present a problem in terms of oscillation characteristics even when this portion is constrained. Since it is desirable for the support members on the first and second electrodes to be spaced as far apart from each other as possible with respect to the longitudinal dimension, it is desirable for the support members to be fixed to positions near the interface between the node portion and the non-node portion. Generally speaking, in the case of a longitudinal oscillation mode element, the node range is approximately ¼ of the length of the element, so that it is possible for the support members to be spaced apart from each other by this distance.

There are various methods of connecting the above-mentioned support members to external conductors. For example, when the support members are formed of a conductive rubber, the support members may be brought into elastically biased contact with the external conductors by using spring terminals or the like. When the support members have no elasticity, the support members may be glued by using a conductive adhesive or the like. When the support members are formed of an uncured conductive adhesive, the support members can be directly joined to the external conductors.

When two grooves are provided on one main surface of the piezoelectric substrate to form three electrodes through division of electrode material by these grooves, it is desirable for the conductive support member fixed to the first, central electrode, and the conductive support members fixed to the second electrodes on either side of the first electrode to be arranged in a zigzag pattern.

When the piezoelectric element is attached to an external component such as a case or a mounting substrate, the following problem may occur. That is, if the piezoelectric element is attached in an inclined state, there is a concern that either of the first and second electrodes will be brought into contact with the external component to thereby degenerate the oscillation characteristics or that a short circuit will be developed. However, when the support members are arranged in a zigzag pattern as described above, a three-point support structure is obtained, so that horizontally is easily attained, thereby achieving an improvement in terms of stability.

Apart from the conductive support members, it is desirable to fix insulating support members to the node portions of the first and second electrodes. In this case, a plurality of support members are provided for one electrode, or the support member has a large length, so that, when the piezoelectric element is attached to the external conductors by the support members, the support area is increased, thereby achieving an improvement in terms of stability. The conductive support members may be brought into close proximity to the insulating support members with respect to the width dimension of the element. Even in that case, there is no concern that a short circuit will be developed.

These and other elements, features, and advantages of the preferred embodiments of the present invention will be apparent from the following detailed description of the preferred embodiments of the present invention, as illustrated in the accompanying drawings.

DETAILED DESCRIPTION OF PREFERRED EMBODIMENTS

Figure 1:
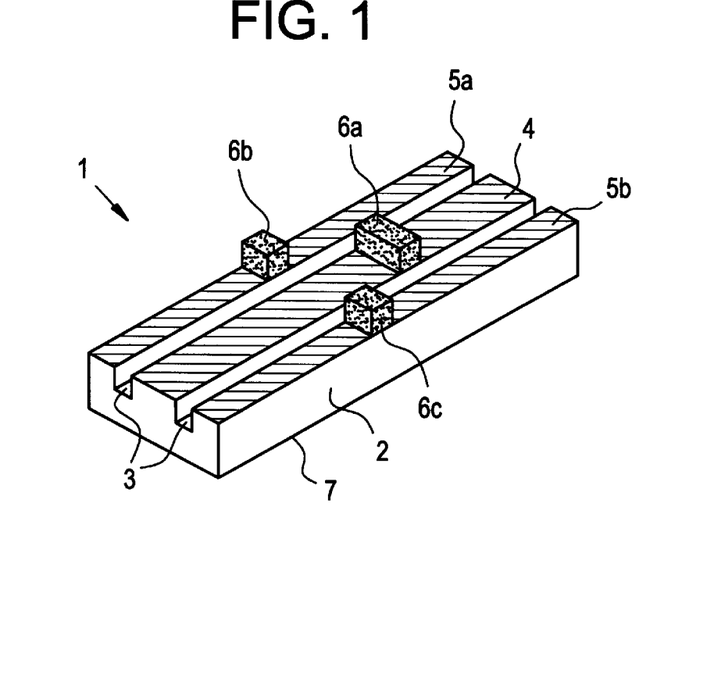
FIG. 1 is a perspective view of a piezoelectric element according to a first preferred embodiment of the present invention.
Figure 2:
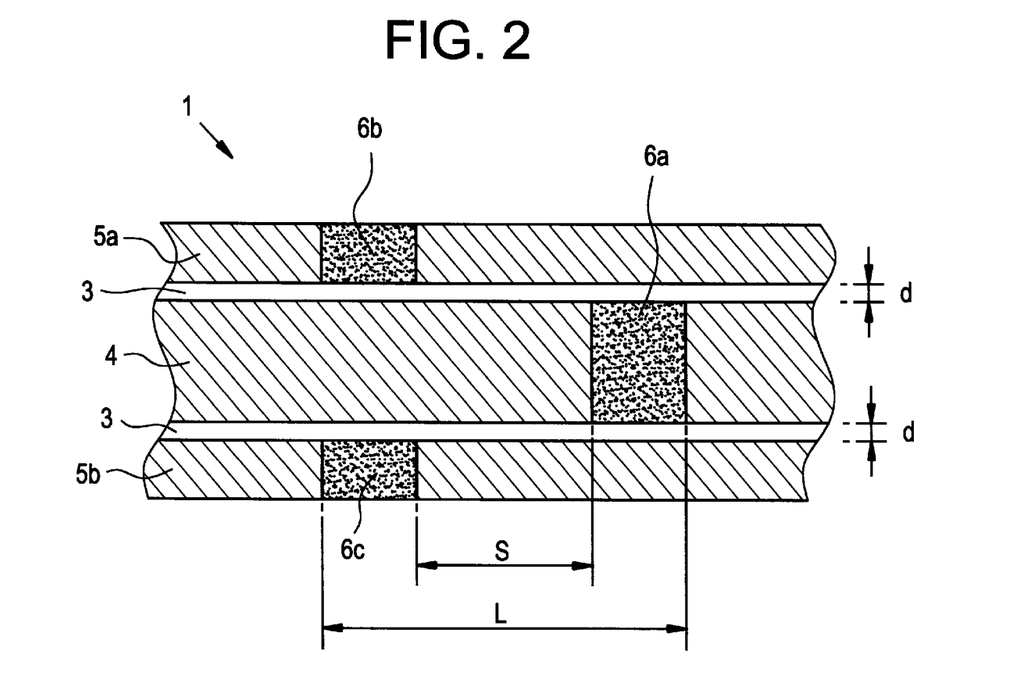
FIG. 2 is an enlarged view of the node portion of the piezoelectric element shown in FIG. 1.

FIGS. 1 and 2 show an example of a piezoelectric element utilizing a longitudinal oscillation mode according to a preferred embodiment of the present invention.

The piezoelectric element 1 preferably includes a slim substantially rectangular piezoelectric ceramic substrate 2. Three electrodes 4, 5a and 5b are preferably provided on a first main surface of the piezoelectric substrate 2 electrodes 4, 5a and 5b are preferably formed by dividing electrode material via two linear groves 3 extending along the longitudinal dimension as shown in FIG. 1. The central, relatively wide electrode 4 preferably constitutes the input electrode, and the relatively narrow electrodes 5a and 5b on either side of the input electrode are the output electrodes. The width of the input electrode 4 is preferably approximately double that of the output electrodes 5a and 5b. It is also possible for the central electrode 4 to be the output electrode and for the electrodes 5a and 5b on either side thereof to be the input electrodes.

Conductive support members 6a, 6b and 6c are fixed to those sections of the element 1 which are on the input electrode 4 and the output electrodes 5a and 5b and which are at the ends of the node portion of the element 1, and the support members 6a, 6b and 6c are preferably generally arranged in a zigzag pattern. The support members 6a, 6b and 6c of this preferred embodiment are preferably formed by applying a conductive paste to the electrodes 4, 5a and 5b to a thickness, for example, of approximately 100 μm and curing it. It is also possible to form the electrodes 4, 5a and 5b of solder bumps, gold bumps or the like. As shown in FIG. 2, the support members 6b and 6c on the output electrodes 5a and 5b are preferably located at the same position with respect to the longitudinal dimension, and the support member 6a on the input electrode 4 is preferably located at a position spaced apart from the support members 6b and 6c by a minimum distance of S along the longitudinal dimension. This distance S is preferably set to be larger than the width d of the grooves 3. The maximum distance L between the support member 6a and the support members 6b and 6c is substantially the same as the length of the node range (for example, approximately ¼ of the element length). The widths of the support members 6a, 6b and 6c, fixed to the electrodes 4, 5a and 5b, are preferably the same as the widths of the electrodes 4, 5a and 5b, respectively.

A common electrode (ground electrode) 7 is provided and preferably formed to cover an entire area of the other main surface of the piezoelectric substrate 2.

Next, a method of producing the piezoelectric element 1, constructed as described above, will be described with reference to FIG. 3.

Figure 3A:
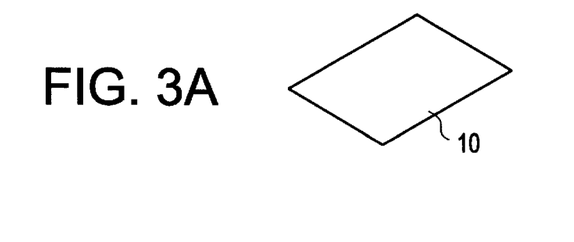
FIG. 3 is a process diagram showing a method of producing the piezoelectric element shown in FIG. 1.

First, a piezoelectric mother substrate 10 as shown in FIG. 3(A) is prepared. Polarization is executed on this mother substrate beforehand, and electrodes are preferably formed substantially over the entire obverse and reverse major surfaces of the mother substrate by a well-known method, such as sputtering. This mother substrate 10 is preferably then temporarily fastened to a holding sheet (not shown).

Figures 3B, 3B:
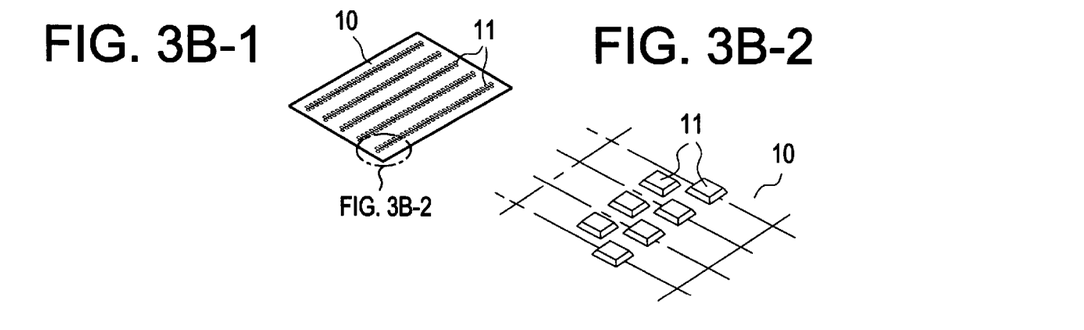

Next, conductive paste portions 11 are screen-printed on one side of the mother substrate 10 preferably in an island-like manner and in a zigzag pattern. After this, the conductive paste portions 11 are cured.

Figure 3C:
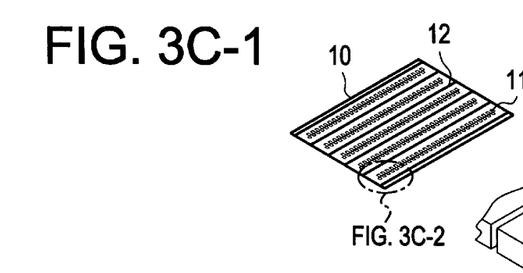
Figure 3C:
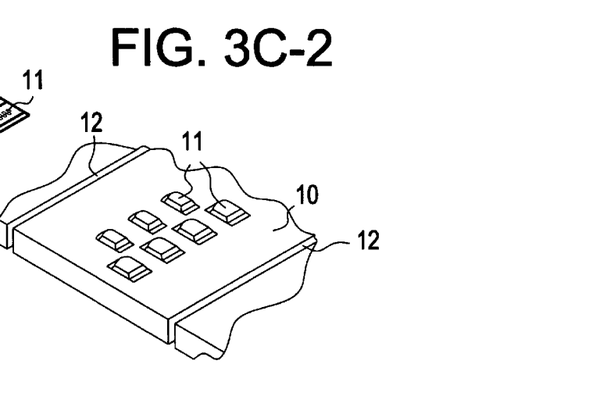

Next, as shown in FIG. 3(C), the side portions of the conductive paste portions 11 are shaped by a slicer or the like to remove any burr and deformed portions from the sides of the conductive paste portions 11. Apart from the side portions of the conductive paste portions 11, the upper surfaces of the conductive paste portions 11 may also be shaped so as to be flat. Simultaneously with the shaping of the conductive paste portions 11, the mother substrate 10 is cut along cut-lines 12 extending substantially longitudinally, i.e., substantially in parallel with the dimension along which the conductive paste portions 11 are arranged. The cutting width is equal to the length of the piezoelectric element 1. By the cutting, the mother substrate 10 is divided into a plurality of parts. However, since they are temporarily fixed to the holding sheet, the parts are not separated from each other.

Figure 3D:
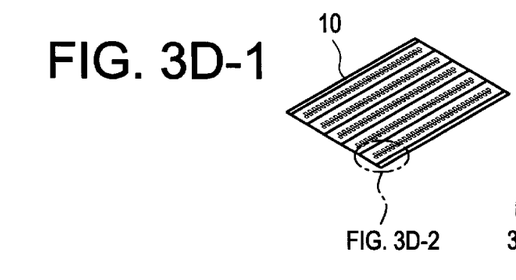
Figure 3D:
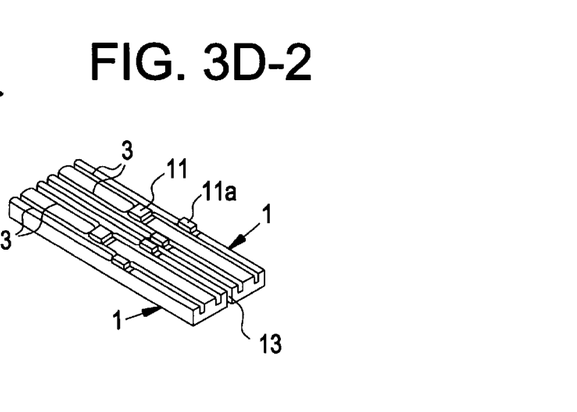

Further, as shown in FIG. 3(D), linear grooves 3 are formed laterally in the mother substrate 10 by using a dicer or the like. These grooves 3 are formed so as to run between the conductive paste portions 11 to thereby separate the electrodes. Simultaneously with the forming of the grooves 3, the mother substrate 10 is preferably cut along cut lines 13 that are substantially parallel to the grooves 3 so that the conductive paste portions 11a of one group of rows are separated in half.

After the completion of the above cutting, the elements obtained are separated from the holding sheet, whereby piezoelectric elements 1 are obtained.

Figure 4:
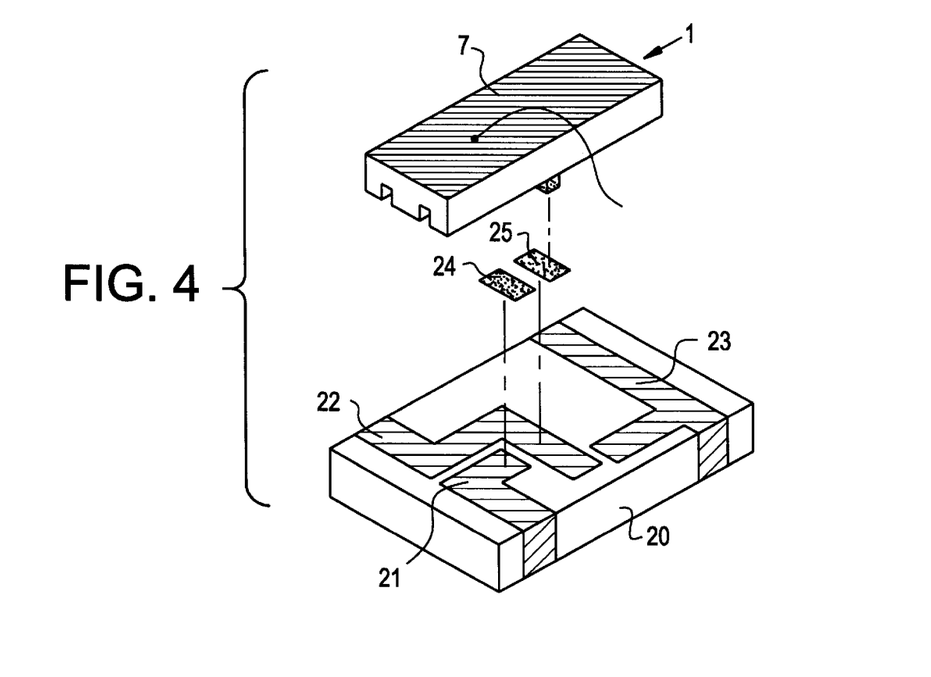
FIG. 4 is an exploded perspective view of a piezoelectric component on which the piezoelectric element shown in FIG. 1 is mounted.
Figure 5:
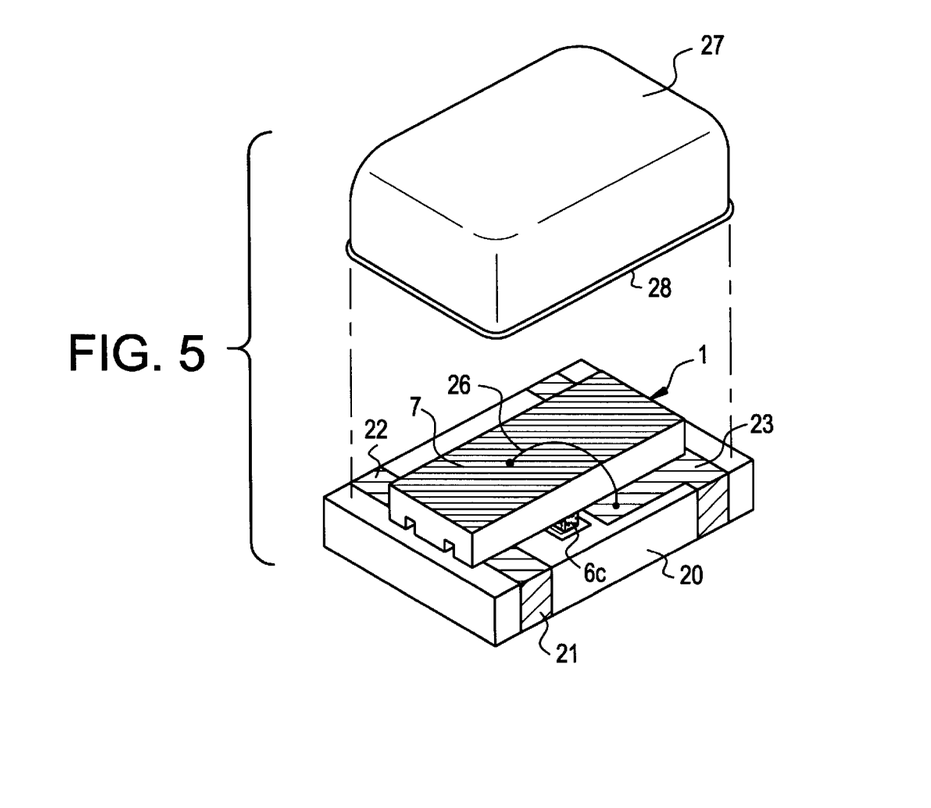
FIG. 5 is a perspective view showing how the piezoelectric element of FIG. 4 is assembled.

FIGS. 4 and 5 show an example of a piezoelectric filter using the above piezoelectric element 1.

A mounting substrate 20 preferably includes a substantially rectangular insulating thin plate formed of alumina ceramics, glass ceramic, glass epoxy resin or the like. As shown in FIG. 4, on the upper side of the mounting substrate 20, three pattern electrodes 21, 22 and 23 on the input side, the output side and the ground side are formed by a well-known method, such as sputtering, evaporation or printing. The pattern electrodes 21, 22 and 23 extend around the side edges of the mounting substrate 20 to the back side or rear surface thereof. Conductive paste 24, 25 is applied to the inner end portions of the pattern electrodes 21 and 22 on the input and output sides by screen printing or the like.

The above piezoelectric element 1 is mounted on the mounting substrate 20 such that the side on which the input and output electrodes 4, 5a and 5b are disposed faces the upper surface of the mounting substrate 20. That is, the support member 6a on the input electrode 4 is glued to the input-side pattern electrode 21, and the support members 6b and 6c on the output electrodes 5a and 5b are glued to the output-side pattern electrode 22 by the conductive paste 24, 25. At this time, the height of the support members 6a, 6b and 6c is as small as, for example, approximately 100 μm, so that a slight inclination of the piezoelectric element 1 may result in the end portion of the piezoelectric element 1 coming into contact with the upper surface of the mounting substrate 20. This contact may interfere with the oscillation characteristics, or in the output electrodes 4, 5a and 5b coming into contact with the pattern electrodes 21 through 23 of different electric potentials to thereby cause defective connection. However, since the piezoelectric element 1 is stably supported by the three support members 6a, 6b and 6c, the element has excellent horizontal stability and prevents interference with the oscillation characteristics and defective connection.

After the gluing of the piezoelectric element 1, a common electrode 7 of the piezoelectric element 1 and the ground side pattern electrode 23 are connected to each other by a conductive wire 26, as shown in FIG. 5. This connection by the wire 26 can be easily effected by a well-known wire bonding method.

After this, a cap 27 for covering the piezoelectric element 1 is glued to the mounting substrate 20 by an adhesive 28 to thereby seal the periphery of the piezoelectric element 1.

Figure 6:
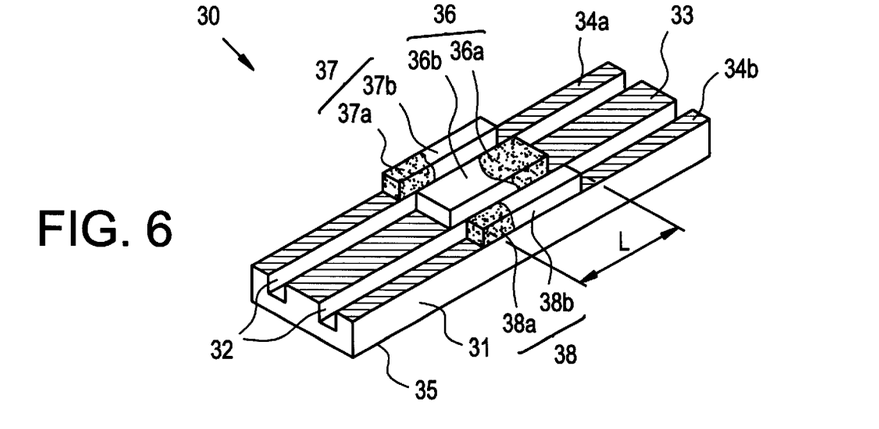
FIG. 6 is a perspective view of a piezoelectric element according to a second preferred embodiment of the present invention.

FIG. 6 shows a second preferred embodiment of a piezoelectric element according to a second preferred embodiment of the present invention.

Like the piezoelectric element of the first preferred embodiment, this piezoelectric element 30 preferably includes a slim substantially rectangular piezoelectric substrate 31. On one main surface of this piezoelectric substrate 31, three electrodes 33, 34a and 34b are formed by dividing electrode material via two grooves 32. The central, relatively wide electrode 33 is preferably the input electrode, and the relatively narrow electrodes 34a and 34b on either side thereof are the output electrodes. On the other main surface of the piezoelectric substrate 31, a common electrode 35 is formed.

Longitudinally extending support members 36, 37 and 38 are fixed to those sections of the element which are on the input electrode 33 and the output electrodes 34a and 34b and which belong to the node portion of the element 30 so as to be arranged substantially in parallel and at the same position with respect to the longitudinal dimension of the element. The support members 36, 37 and 38 of this preferred embodiment are composed of conductive portions 36a, 37a and 38a and insulating portions 36b, 37b and 38b. The conductive portion 36a on the input electrode 33 and the conductive portions 37a and 38a on the output electrodes 34a and 34b are formed on the opposite end portions of the support members 36, 37 and 38. Thus, the conductive portions 36a, 37a and 38a are spaced apart from each other with respect to the longitudinal dimension of the element and arranged in a zigzag pattern. In the case of this preferred embodiment, the support members 36, 37 and 38 are preferably formed so as to cover an entire area of the node region of the element 30, and the length L of the support members preferably is set to be approximately ¼ of the entire length of the element 30.

Next, a method of producing the piezoelectric element 30, constructed as described above, will be described with reference to FIG. 7.

Figure 7A:
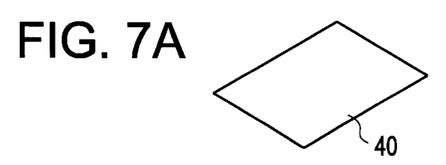
FIG. 7 is a process diagram showing a method of producing the piezoelectric element shown in FIG. 6.

First, a piezoelectric mother substrate 40 as shown in FIG. 7(A) is prepared. Polarization of the mother substrate 40 is done beforehand, and an electrode is formed to cover substantially on the entire obverse and reverse sides of the substrate by a well-known method, such as sputtering. This mother substrate 40 is temporarily fastened to a holding sheet (not shown).

Figure 7B:
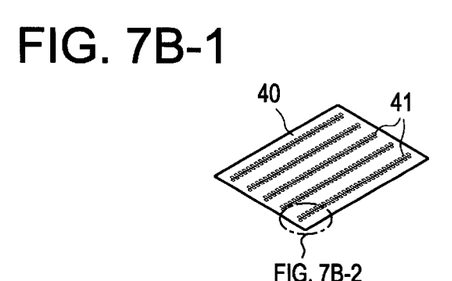
Figure 7B:
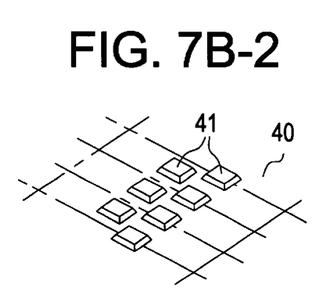

Next, as shown in FIG. 7(B), conductive paste portions 41 are screen-printed on one side of the mother substrate 40 in an island-like manner and in a zigzag pattern. The thickness of the conductive paste portions 41 is preferably larger than the thickness of the support members finally obtained. After this, the conductive paste portions 41 undergo a curing process.

Figure 7C:
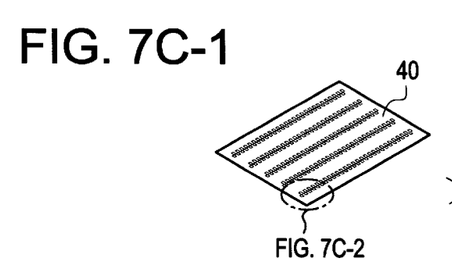
Figure 7C:
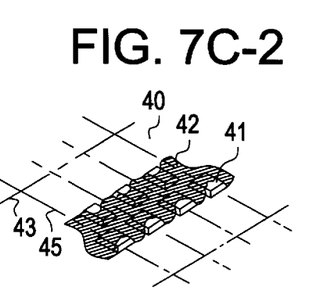

Next, as shown in FIG. 7(C), an insulating paste 42 is applied in a strip-like fashion so as to fill the gaps of the conductive paste portions 41 and then cured. At this time, the insulating paste 42 is applied not only to the gaps of the conductive paste portions 41, but partly to the upper sides thereof.

Figure 7D:
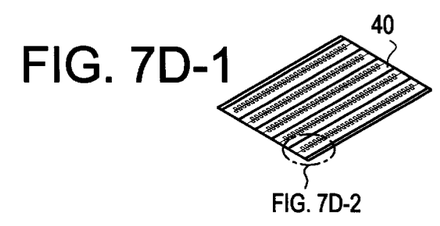
Figure 7D:
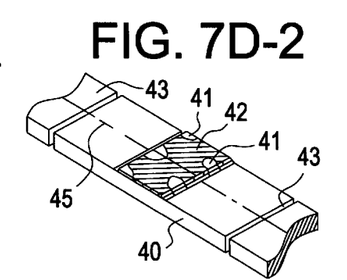

Next; as shown in FIG. 7(D), a grinder, for example, is used to grind the upper surfaces of the conductive paste portions 41 and the insulating paste 42 such that the their upper surfaces have substantially the same height.

After the grinding, the side surfaces of the insulating paste 42 including the conductive paste portions 41 are shaped by a slicer or the like to remove any burr, deformed portions, etc. from either side of the conductive paste portions 41 and the insulating paste 42. At the same time, the mother substrate 40 is cut along cut lines 43 which extend longitudinally, that is, substantially in parallel with the dimension along which the conductive paste portions 41 are arranged. The cutting width is the same as the length of the piezoelectric element 1.

Figure 7E:
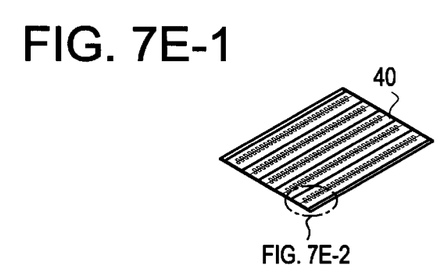
Figure 7E:
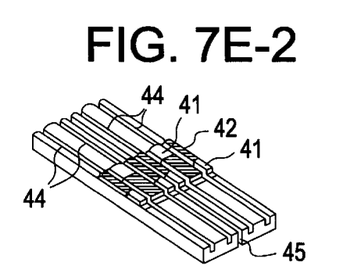

Further, as shown in FIG. 7(E), linear grooves 44 are formed along the lateral dimension of the mother substrate 40 by using a dicer or the like. These grooves 44 are formed so as to pass between the conductive paste portions 41 and divide the electrodes. Simultaneously with the working of the grooves 44, the mother substrate 40 is cut along cut lines 45 that are disposed substantially in parallel with the grooves 44 so as to divide the conductive paste portions 41 of one group of rows in half, thereby obtaining a piezoelectric element 30.

Figure 8:
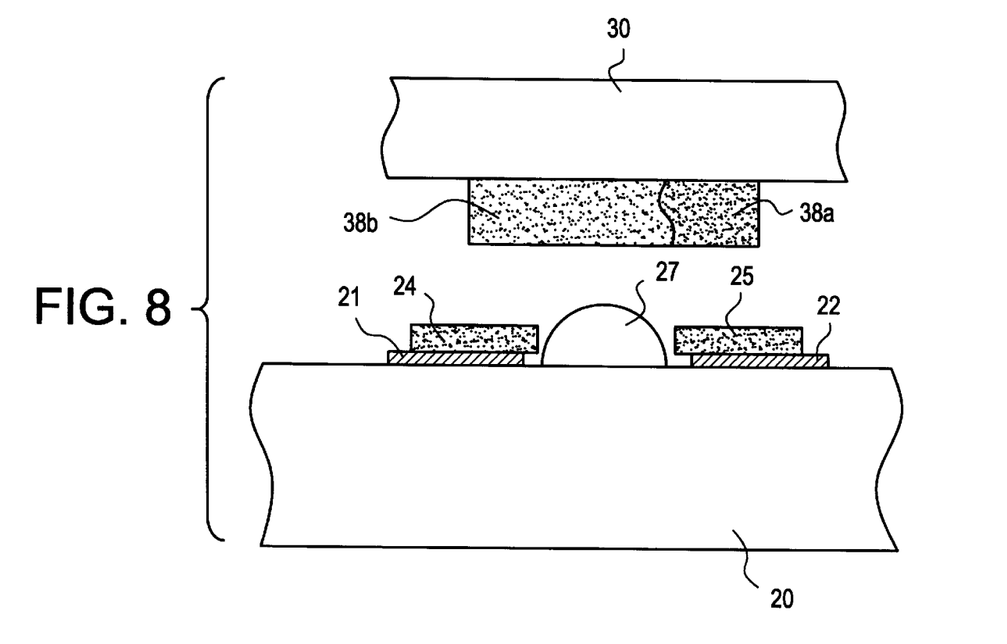
FIG. 8 is an enlarged view showing how the piezoelectric element of FIG. 6 is mounted on a mounting substrate.

When mounting the above piezoelectric element 30 to a mounting substrate 20, a conductive adhesive 24, 25 is applied, as shown in FIG. 8, to the pattern electrodes 21 and 22 on the input and output sides of the mounting substrate 20 by screen printing or the like, and an insulating adhesive 27 for holding the element is applied between the pattern electrodes 21 and 22 by pin transfer or the like. It is desirable for the thickness of the insulating adhesive 27 to be larger than the sum of the thicknesses of the pattern electrodes 21 and 22 and that of the conductive adhesive portions 24 and 25.

Next, the piezoelectric element 30 is glued to the upper surface of the mounting substrate 20 such that the conductive portion 37a of the support member 37 corresponds to a location of the input side pattern electrode 21 and that the conductive portions 36a and 38a of the support members 36 and 38 correspond to a location of the output side pattern electrode 22. At this time, the insulating adhesive 27 applied between the pattern electrodes 21 and 22 adheres to the insulating portions 36b through 38b of the support members 36 through 38, whereby the mounting substrate 20 and the piezoelectric element 30 are glued and secured to each other.

Generally speaking, the adhesive strength of the insulating adhesive 27 is greater than that of the conductive adhesive 24, 25, so that the mounting substrate 20 and the piezoelectric element 30 can be firmly and reliably adhered to each other. That is, the conductive adhesive 24, 25 is used mainly for the purpose of effecting electrical conduction of the conductive portions 36a through 38a of the support members 36 through 38 and the pattern electrodes 21 and 22, and the insulating adhesive 27 is used for the purpose of mechanically fixing the mounting substrate 20 and the piezoelectric element 30 to each other, so that the adhesive strength of the conductive adhesive 24, 25 need not be particularly great. Thus, the materials of the adhesives 24, 25 and 27 can be selected according to their respective purposes, thus achieving an improvement in terms of freedom of choice.

Figure 9:
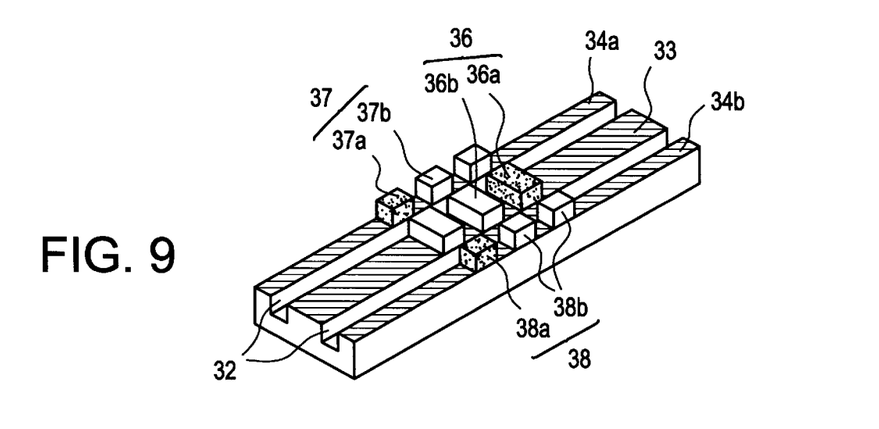
FIG. 9 is a perspective view of a piezoelectric element according to a third preferred embodiment of the present invention.
Figure 10:
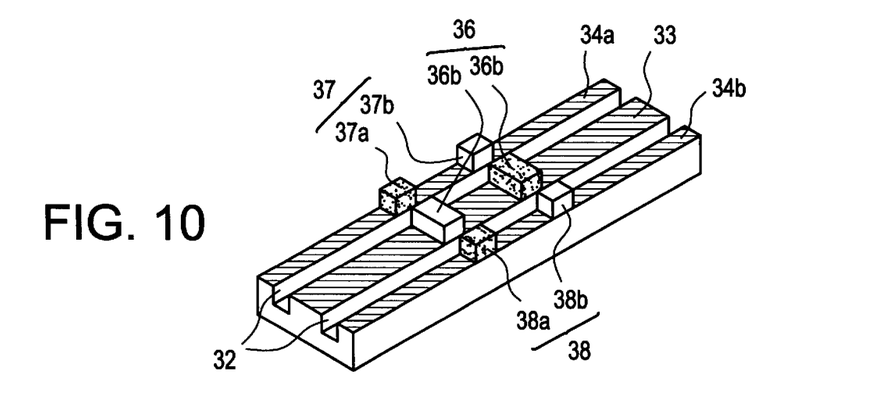
FIG. 10 is a perspective view of a piezoelectric element according to a fourth preferred embodiment of the present invention.

When providing support members 36 through 38 having conductive portions and insulating portions, there is no need to form them continuously along the longitudinal dimension as shown in FIG. 6; it is possible to separate the conductive portions 36a through 38a from the insulating portions 36b through 38b, as shown in FIGS. 9 and 10. In any case, the conductive portions 36a through 38a are secured in position so as to be spaced apart from each other with respect to the longitudinal dimension of the element. In this example, the electrodes 33, 34a and 34b are exposed between the conductive portions 36a through 38a and the insulating portions 36b through 38b. However, it is also possible for the electrodes to be covered with a thin support member.

The present invention is not restricted to the above preferred embodiments.

While in the above preferred embodiments the input and output electrodes of the piezoelectric element are formed through division of electrode material into three sections by two grooves, it is also possible for the electrodes to be formed through division of electrode material into two sections by one groove. In this case, the support members secured to the electrodes are not arranged in a zigzag pattern, but positioned so as to be shifted from each other with respect to the longitudinal dimension of the element.

Further, while in the above preferred embodiments, when the input and output electrodes of the piezoelectric element are formed through division of electrode material into three sections by two grooves, the width of the central electrode is larger than that of the electrodes on either side thereof, it is also possible for the electrodes to have the same width. However, when the width of the central electrode is larger than that of the electrodes on either side thereof as in the case of the above preferred embodiments, the width of the support member fixed to the central electrode is also relatively large, so that an improvement in stability is achieved in gluing the element to the mounting substrate or the like, thereby making it advantageously possible to reliably prevent inclination of the element with respect to the longitudinal dimension.

As is apparent from the above description, in accordance with the preferred embodiments of the present invention, one main surface of a piezoelectric substrate is provided with first and second electrodes formed through division of electrode material by linear grooves extending along the longitudinal dimension of the substrate, and conductive support members are secured to the node portions of the first and second electrodes so as to be spaced apart from each other with respect to the longitudinal dimension of the piezoelectric substrate, so that, even if the piezoelectric element is positionally deviated to some degree when connecting the first and second electrodes of the piezoelectric element to external conductors, there is no concern that a short circuit is developed between the first and second electrodes, thereby making it possible to obtain a piezoelectric element having a high level of connection reliability.

Further, since the support members are secured in position so as to be spaced apart from each other with respect to the longitudinal dimension of the piezoelectric substrate, the effect of preventing the piezoelectric element from being inclined with respect to the longitudinal dimension is enhanced when the piezoelectric element is mounted to external conductors, whereby it is possible to prevent or restrain hindrance to the oscillation as a result of the end portion of the piezoelectric element coming into contact with the external conductors, etc.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A piezoelectric element comprising:

a piezoelectric substrate having a first main surface and a second main surface;

at least a first and a second electrode disposed on said first main surface of the piezoelectric substrate and being separated from each other by at least one longitudinally extending groove;

a third electrode disposed on said second main surface of the piezoelectric substrate; and a first conductive support member disposed on the first electrode and a second conductive support member disposed on the second electrode such that the first and second conductive support members are spaced apart from each other with respect to a longitudinal dimension of the piezoelectric substrate.

2. A piezoelectric element according to claim 1, wherein the first and second conductive support members are secured to a vicinity of node portions of the first and second electrodes.

3. A piezoelectric element according to claim 1, wherein the first main surface of said piezoelectric substrate has three electrodes disposed thereon including the first and second electrodes, the three electrodes being separate from each other by two longitudinally extending grooves formed in the first main surface of the piezoelectric substrate and the conductive support members are arranged in zigzag pattern.

4. A piezoelectric element according to claim 3, wherein one of the three electrodes has a width that is greater than a width of the other two of the three electrodes.

5. A piezoelectric element according to claim 1, further comprising insulating support members disposed on the piezoelectric substrate.

6. A piezoelectric element according to claim 5, wherein the insulating support members are secured to a vicinity of node portions of the first and second electrodes.

7. A piezoelectric element according to claim 1, wherein the conductive support members each include an insulative portion.

8. A piezoelectric element according to claim 1, wherein the piezoelectric substrate is adapted to vibrate in a longitudinal oscillation mode.

* * * * *